United States Patent
Cho et al.

(10) Patent No.: US 8,274,332 B2
(45) Date of Patent: Sep. 25, 2012

(54) N-WAY DOHERTY DISTRIBUTED POWER AMPLIFIER WITH POWER TRACKING

(75) Inventors: Kyoung Joon Cho, Coquitlam (CA); Wan Jong Kim, Coquitlam (CA); Shawn Patrick Stapleton, Burnaby (CA)

(73) Assignee: Dali Systems Co. Ltd., George Town Grand Cayman (KY)

( * ) Notice: Subject to any disclaimer, the term of this patent is extended or adjusted under 35 U.S.C. 154(b) by 0 days.

(21) Appl. No.: 12/603,419

(22) Filed: Oct. 21, 2009

(65) Prior Publication Data
US 2010/0176885 A1   Jul. 15, 2010

Related U.S. Application Data

(63) Continuation-in-part of application No. 12/108,507, filed on Apr. 23, 2008, now Pat. No. 7,688,135.

(60) Provisional application No. 60/925,577, filed on Apr. 23, 2007.

(51) Int. Cl.
*H03F 3/68* (2006.01)

(52) U.S. Cl. ........ 330/295; 330/124 R; 330/84; 330/286

(58) Field of Classification Search .................. 330/136, 330/295, 124 R, 53, 84, 286
See application file for complete search history.

(56) References Cited

U.S. PATENT DOCUMENTS

| | | | |
|---|---|---|---|
| 4,638,248 A | 1/1987 | Schweickert | |
| 4,700,151 A | 10/1987 | Nagata | |
| 4,890,300 A | 12/1989 | Andrews | |
| 4,929,906 A | 5/1990 | Voyce et al. | |
| 5,049,832 A | 9/1991 | Cavers | |
| 5,121,412 A | 6/1992 | Borth | |
| 5,132,639 A | 7/1992 | Blauvelt et al. | |
| 5,396,190 A | 3/1995 | Murata | |
| 5,486,789 A | 1/1996 | Palandech et al. | |
| 5,579,342 A | 11/1996 | Crozier | |
| 5,675,287 A | 10/1997 | Baker et al. | |

(Continued)

FOREIGN PATENT DOCUMENTS

JP   2000-278237 A   10/2000

(Continued)

OTHER PUBLICATIONS

International Search Report and Written Opinion of PCT/US2008/061355 mailed on Aug. 4, 2008, 7 pages.

(Continued)

*Primary Examiner* — Hieu Nguyen
(74) *Attorney, Agent, or Firm* — Kilpatrick Townsend & Stockton LLP (57) ABSTRACT

A power amplifier using N-way Doherty structure with adaptive bias supply power tracking for extending the efficiency region over the high peak-to-average power ratio of the multiplexing modulated signals such as wideband code division multiple access and orthogonal frequency division multiplexing is disclosed. In an embodiment, the present invention uses a dual-feed distributed structure to an N-way Doherty amplifier to improve the isolation between at least one main amplifier and at least one peaking amplifier and, and also to improve both gain and efficiency performance at high output back-off power. Hybrid couplers can be used at either or both of the input and output. In at least some implementations, circuit space is also conserved due to the integration of amplification, power splitting and combining.

27 Claims, 13 Drawing Sheets

U.S. PATENT DOCUMENTS

| | | | |
|---|---|---|---|
| 5,678,198 A | 10/1997 | Lemson | |
| 5,732,333 A | 3/1998 | Cox et al. | |
| 5,757,229 A * | 5/1998 | Mitzlaff | 330/124 R |
| 5,786,728 A | 7/1998 | Alinikula | |
| 5,936,464 A | 8/1999 | Grondahl | |
| 5,937,011 A | 8/1999 | Carney et al. | |
| 5,949,283 A | 9/1999 | Proctor et al. | |
| 5,959,499 A | 9/1999 | Khan et al. | |
| 5,963,549 A | 10/1999 | Perkins et al. | |
| 6,054,896 A | 4/2000 | Wright et al. | |
| 6,055,418 A | 4/2000 | Harris et al. | |
| 6,091,941 A | 7/2000 | Moriyama et al. | |
| 6,141,390 A | 10/2000 | Cova | |
| 6,166,601 A | 12/2000 | Shalom et al. | |
| 6,240,144 B1 | 5/2001 | Ha | |
| 6,242,979 B1 | 6/2001 | Li | |
| 6,246,286 B1 | 6/2001 | Persson | |
| 6,246,865 B1 | 6/2001 | Lee | |
| 6,275,685 B1 | 8/2001 | Wessel et al. | |
| 6,301,579 B1 | 10/2001 | Becker | |
| 6,400,774 B1 | 6/2002 | Matsuoka et al. | |
| 6,424,225 B1 | 7/2002 | Choi et al. | |
| 6,512,417 B2 | 1/2003 | Booth et al. | |
| 6,552,609 B2 | 4/2003 | Hamada et al. | |
| 6,552,634 B1 | 4/2003 | Raab | |
| 6,625,429 B1 | 9/2003 | Yamashita | |
| 6,639,050 B1 | 10/2003 | Kieliszewski | |
| 6,697,436 B1 | 2/2004 | Wright et al. | |
| 6,703,897 B2 | 3/2004 | O'Flaherty et al. | |
| 6,741,663 B1 | 5/2004 | Tapio et al. | |
| 6,747,649 B1 | 6/2004 | Sanz-Pastor et al. | |
| 6,751,447 B1 | 6/2004 | Jin et al. | |
| 6,794,931 B2 | 9/2004 | Kenington | |
| 6,798,295 B2 * | 9/2004 | Pengelly et al. | 330/295 |
| 6,963,242 B2 | 11/2005 | White et al. | |
| 6,983,025 B2 | 1/2006 | Schell | |
| 7,035,345 B2 | 4/2006 | Jeckeln et al. | |
| 7,042,287 B2 | 5/2006 | Robinson | |
| 7,061,314 B2 | 6/2006 | Kwon et al. | |
| 7,064,606 B2 | 6/2006 | Louis | |
| 7,079,818 B2 | 7/2006 | Khorram | |
| 7,102,442 B2 | 9/2006 | Anderson | |
| 7,103,329 B1 | 9/2006 | Thon | |
| 7,104,310 B2 | 9/2006 | Hunter | |
| 7,106,806 B1 | 9/2006 | Kenington | |
| 7,109,792 B2 | 9/2006 | Leffel | |
| 7,109,998 B2 | 9/2006 | Smith | |
| 7,151,913 B2 | 12/2006 | Ahmed | |
| 7,158,765 B2 | 1/2007 | Blair et al. | |
| 7,193,472 B2 * | 3/2007 | Gotou et al. | 330/295 |
| 7,248,642 B1 | 7/2007 | Vella-Coleiro | |
| 7,259,630 B2 | 8/2007 | Bachman, II et al. | |
| 7,321,635 B2 | 1/2008 | Ocenasek et al. | |
| 7,321,636 B2 | 1/2008 | Harel et al. | |
| 7,342,444 B2 * | 3/2008 | Kim et al. | 330/124 R |
| 7,372,918 B2 | 5/2008 | Muller et al. | |
| 7,382,194 B2 | 6/2008 | Apel | |
| 7,469,491 B2 | 12/2008 | McCallister et al. | |
| 7,688,135 B2 | 3/2010 | Kim et al. | |
| 7,831,221 B2 | 11/2010 | Leffel et al. | |
| 7,847,630 B2 * | 12/2010 | Okubo et al. | 330/124 R |
| RE42,287 E | 4/2011 | Apodaca et al. | |
| 7,986,186 B2 * | 7/2011 | Marbell et al. | 330/136 |
| 2002/0034260 A1 | 3/2002 | Kim | |
| 2002/0044014 A1 | 4/2002 | Wright et al. | |
| 2002/0080891 A1 | 6/2002 | Ahn et al. | |
| 2002/0101937 A1 | 8/2002 | Antonio et al. | |
| 2002/0101938 A1 | 8/2002 | Horaguchi et al. | |
| 2002/0186783 A1 | 12/2002 | Opas et al. | |
| 2002/0187761 A1 | 12/2002 | Im et al. | |
| 2002/0193085 A1 | 12/2002 | Mathe et al. | |
| 2003/0095608 A1 | 5/2003 | Duperray | |
| 2003/0179829 A1 | 9/2003 | Pinckley et al. | |
| 2003/0179830 A1 | 9/2003 | Eidson et al. | |
| 2003/0207680 A1 | 11/2003 | Yang et al. | |
| 2004/0017859 A1 | 1/2004 | Sills et al. | |
| 2004/0212428 A1 | 10/2004 | Ode et al. | |
| 2004/0240585 A1 | 12/2004 | Bishop et al. | |
| 2005/0059360 A1 | 3/2005 | Kenington | |
| 2005/0079834 A1 | 4/2005 | Maniwa et al. | |
| 2005/0159117 A1 | 7/2005 | Bausov et al. | |
| 2005/0262498 A1 | 11/2005 | Ferguson et al. | |
| 2006/0012426 A1 | 1/2006 | Nezami | |
| 2006/0270366 A1 | 11/2006 | Rozenblit et al. | |
| 2007/0075780 A1 * | 4/2007 | Krvavac et al. | 330/295 |
| 2007/0171234 A1 | 7/2007 | Crawfis et al. | |
| 2007/0241812 A1 | 10/2007 | Yang et al. | |
| 2008/0191801 A1 | 8/2008 | Kim et al. | |
| 2008/0265996 A1 | 10/2008 | Kim et al. | |
| 2008/0284509 A1 | 11/2008 | Kim et al. | |
| 2009/0115512 A1 | 5/2009 | Grondahl et al. | |
| 2011/0175677 A1 * | 7/2011 | Jeong et al. | 330/124 R |

FOREIGN PATENT DOCUMENTS

| | | |
|---|---|---|
| JP | 2002-536902 A | 10/2002 |
| JP | 2003-304122 A | 10/2003 |
| WO | 00/46916 A1 | 8/2000 |

OTHER PUBLICATIONS

International Search Report and Written Opinion of PCT/IB2008/003079 mailed on May 11, 2009, 9 pages.

Japanese Patent Office, "Notice of Reasons for Rejection," for Japanese Patent Application No. 2010-506483 dated Jan. 23, 2012, 3 pages.

Stapleton, S., et al., "An Adaptive Predistorter for a Power Amplifier Based on Adjacent Channel Emissions," IEEE Transactions on Vehicular Technology, vol. 41, No. 1, 1992, 8 pages.

U.S. Appl. No. 12/108,502 filed Apr. 23, 2008, Final Office Action mailed Sep. 23, 2011, 20 pages.

U.S. Appl. No. 12/108,502 filed Apr. 23, 2008, Office Action mailed Dec. 29, 2010, 15 pages.

U.S. Appl. No. 12/108,502 filed Apr. 23, 2008, Final Office Action mailed Apr. 14, 2010, 15 pages.

U.S. Appl. No. 12/108,502 filed Apr. 23, 2008, Office Action mailed Jul. 23, 2009, 16 pages.

U.S. Appl. No. 12/108,507 filed Apr. 23, 2008, Notice of Allowance mailed Jun. 19, 2009, 9 pages.

* cited by examiner

Figure 1. Schematic diagram showing an N-way Doherty amplifier using the dual-fed distributed (DFD) method of the present invention.

FIG 2. A graph showing efficiency characteristics of an Nway Doherty dual-fed distributed amplifier at various output back-off power levels.

Figure 3. A schematic diagram showing a 3-way Doherty distributed amplifier of the present invention.

FIGURE 4. A graph showing simulation results of gain and power added efficiency performance (PAE) of the 3-way Doherty distributed amplifier of the present invention.

FIGURE 5. A graph showing measurement results of gain and power added efficiency performance (PAE) of the 3-way Doherty distributed amplifier of the present invention.

FIGURE 6. A graph showing measurement results of gain and PAE performance variation as a function of the shunt capacitor and bias voltage of peaking amplifiers for single-tone signal using the 3-way Doherty distributed amplifier of the present invention.

Figure 7 - A graph showing measurement results of spectrum for a single WCDMA carrier using the 3-way Doherty distributed amplifier of the present invention.

FIG. 8. Basic Digital Hybrid Mode Power Amplifier System

N-WAY DOHERTY DISTRIBUTED POWER AMPLIFIER WITH POWER TRACKING

RELATED APPLICATIONS

This application claims the benefit of priority under 35 U.S.C. §119(e) to U.S. patent application Ser. No. 12/108,507, filed Apr. 23, 2008, and through it to U.S. provisional patent application Ser. No. 60/925,577, filed Apr. 23, 2007.

FIELD OF THE INVENTION

The present invention generally relates to high power communication systems. More specially, the present invention relates to high efficiency high power amplifiers for such systems.

BACKGROUND OF THE INVENTION

In modern digital wireless communication systems, such as IS-95, PCS, WCDMA, OFDM and so on, the power amplifiers have advanced towards having a wide bandwidth and large number of carriers. Recently, orthogonal frequency division multiplexing (OFDM) modulation is an attractive technique for transmitting information efficiently within a limited bandwidth like WiBRO and WiMAX. However, since the OFDM signal consists of a number of independently modulated sub-carriers, it produces a higher peak-to-average power ratio (PAR) signal. A typical PAR for a 64-subcarrier OFDM signal is around 8-13 dB. When the number of sub-carriers is increased to 2048, the PAR also increases, typically from 11 to 16 dB. The power amplifiers designed to operate with these high PARs typically have significantly deteriorated efficiency.

The Doherty amplifier is known as a technique for improving the efficiency at high output back-off power. Its primary advantage is the ease of configuration when applied to high power amplifiers, unlike other efficiency enhancement amplifiers or techniques such as switching mode amplifiers, EER, LINC and so on. Recent results have been reported on its use as: a symmetric Doherty structure, an asymmetric Doherty structure with uneven power transistors, and a N-way Doherty structure using multi-paralleled transistors. In the case of the symmetric Doherty amplifier, the maximum efficiency point is obtained at 6 dB back-off power.

The asymmetric Doherty amplifier can obtain a high efficiency at various back-off powers using a combination of different power device sizes for the main and peaking amplifiers. Unfortunately, it is difficult to optimize the gain and output power of the asymmetric Doherty amplifier because of the different device matching circuits and the delay mismatch between the main amplifier and the peaking amplifier.

The conventional N-way Doherty amplifier has an efficiency enhancement over a conventional 2-way Doherty structure by using multiple parallel transistors of identical devices. Its one drawback is that the total gain will be reduced due to the loss of the N-way input power splitter. Under low gain situations this will increase the power dissipation of the driving amplifier.

Further, while the conventional N-way Doherty amplifier can offer improved efficiency at high output back-off power, the performance of conventional N-way Doherty amplifiers deteriorates as to both gain and efficiency for higher peak-to-average power ratio (PAPR) signals.

Hence, a need remains in the arts for a method of applying both circuit-level and system-level techniques simultaneously for improving the gain and efficiency performance of N-way Doherty amplifier at high output back-off power in the high power communication systems.

SUMMARY OF THE INVENTION

Accordingly, the present invention has been made in view of the above problems, and it is an object of the present invention to provide a method for improving the gain and efficiency performance of the Doherty amplifying structure at high output back-off power for high power communication system applications. To achieve the above objects, according to the present invention, the technique employs dual-feed distributed amplifying. The power splitter and combiner of the conventional N-way Doherty amplifier are replaced by hybrid couplers with transmission lines. Compared to the conventional N-way Doherty amplifier, the present invention is able to achieve good isolation at the input and output as well as high gain performance with high efficiency. In an embodiment, a power tracking adaptive bias supply technique is employed. The drain bias voltages and gate bias voltages are adaptively controlled by the input power level. Two alternative approaches as disclosed: 1) Envelope tracking 2) Average power tracking. The envelope tracking technique requires a fast switching power supply whereas the average power tracking technique adapts significantly slower. The power detection circuit can be implemented either using analog circuitry or using digital signal processing.

BRIEF DESCRIPTION OF DRAWINGS

Further objects and advantages of the invention can be more fully understood from the following detailed description taken in conjunction with the accompanying drawings in which.

DETAILED DESCRIPTION OF THE INVENTION

In general, the present invention, involves the use of a single-ended dual-feed distributed (SEDFD) amplifying method with an N-way Doherty amplifier structure, so as to achieve high gain and high efficiency performances at high output back-off power. In some embodiments, the gain and efficiency performance is also maximized by adjusting the gate bias of N-way peaking amplifiers and shunt capacitors at the end of the half-wave length gate and drain lines, respectively. Compared to conventional N-way Doherty amplifiers, therefore, the present invention achieves higher power added efficiency (PAE) and higher gain for the multiplexing modulated signals. The method and apparatus provided by the present invention is therefore referred as an N-way Doherty Distributed Power Amplifier (NWDPA) hereafter.

Various embodiments of the NWDPA according to the present invention will now be described in detail with reference to the accompanying drawings.

Figure 1:
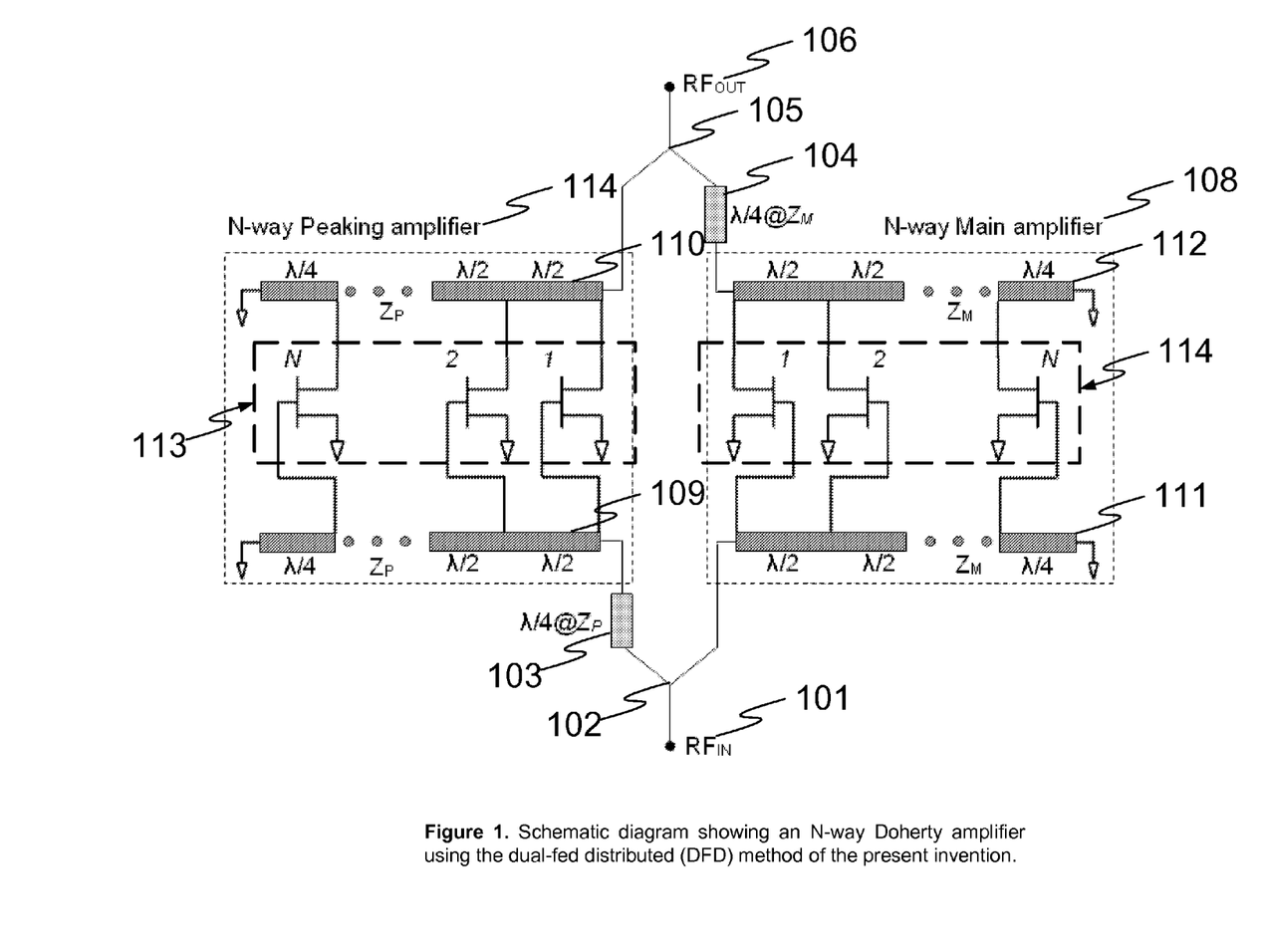
FIG. 1 is schematic diagram showing an embodiment of an N-way Doherty amplifier using a dual-feed distributed (DFD) method in accordance with the present invention.

FIG. 1 is a schematic diagram showing an N-way Doherty amplifier using the SEDFD method of the present invention. The RF input signal 101 is provided as an input to main SEDFD amplifier 108 and peaking SEFDF amplifier 107 by means of a power splitter. Each SEDFD amplifier consists of two transmission lines 109, 110, 111, 112 and N multiple transistors 113, 114. All transistors 113, 114 in the SEDFD main amplifier 107 and peaking amplifier 108 are connected by both gate and drain lines 109, 110, 111, 112 with a half-wave length at the center frequency and operate identically. The input signal of the SEDFD amplifier 107, 108 is distributed along the gate line 109, 111 and the amplified output signal is combined along the drain line 110, 112. Since each transistor adds power in phase to the signal, the SEDFD amplifier 107, 108 is able to provide higher gain. A λ/4 microstrip line 103 is prior to the SEDFD peaking amplifier 107 in order to synchronize the phases between the SEDFD main amplifier 108 and the SEDFD peaking amplifier 107. The output signal of the SEDFD main amplifier 108 is passed through a microstrip λ/4 impedance transformer 104 and combined with the output signal of the SEDFD peaking amplifier 107 by the power combiner 105.

Figure 2:
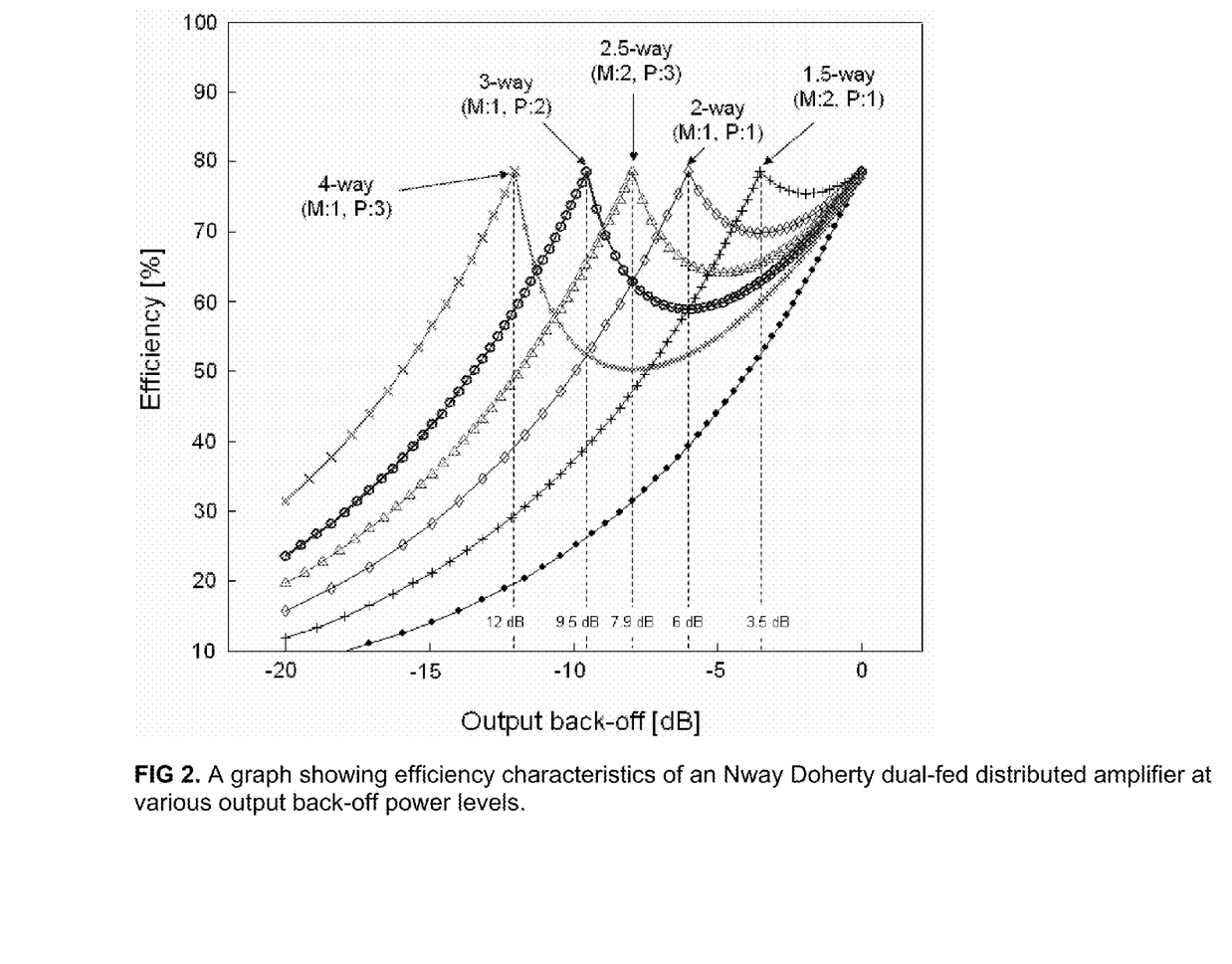
FIG. 2 is a graph showing efficiency characteristics of an N-way Doherty dual-feed distributed amplifier at various levels of output back-off power with analog adaptive power tracking in accordance with the invention.

FIG. 2 is a graph showing efficiency characteristics of an NWDPA at various output back-off power. The efficiency of the NWDPA for the maximum power level is given by $$\eta = \frac{\pi}{4},$$

and the efficiency for the medium power level is given by $$\eta = \frac{\pi}{4} \cdot \frac{\left(\frac{P}{M}+1\right) \cdot \left(\frac{v_o}{v_{max}}\right)^2}{\left(\frac{P}{M}+2\right) \cdot \left(\frac{v_o}{v_{max}}\right) - 1}$$

where $v_o$ and $v_{max}$ are the output voltage and the maximum output voltage, respectively, M is the number of transistors for the main amplifier, and P the number of transistors for the peaking amplifier. Depending upon the embodiment, the main and peaking amplifiers can be either single transistors or multiple transistors, or other forms of amplifiers. In addition, the transistors can be discrete or integrated, again depending upon the embodiment.

For the low power level, the efficiency of the NWDPA is expressed as $$\eta = \frac{\pi}{4} \cdot \left(\frac{P}{M}+1\right) \cdot \frac{v_o}{v_{max}}.$$

The efficiency of the amplifier for various levels of output back-off power is calculated as a function of the number of the main and peaking amplifiers. The relationship between the extended back-off state $X_{BO}$ and the number of main and peaking amplifiers is given by $$X_{BO} = 20 \cdot \log_{10}\left(\frac{P}{M}+1\right).$$

Figure 3:
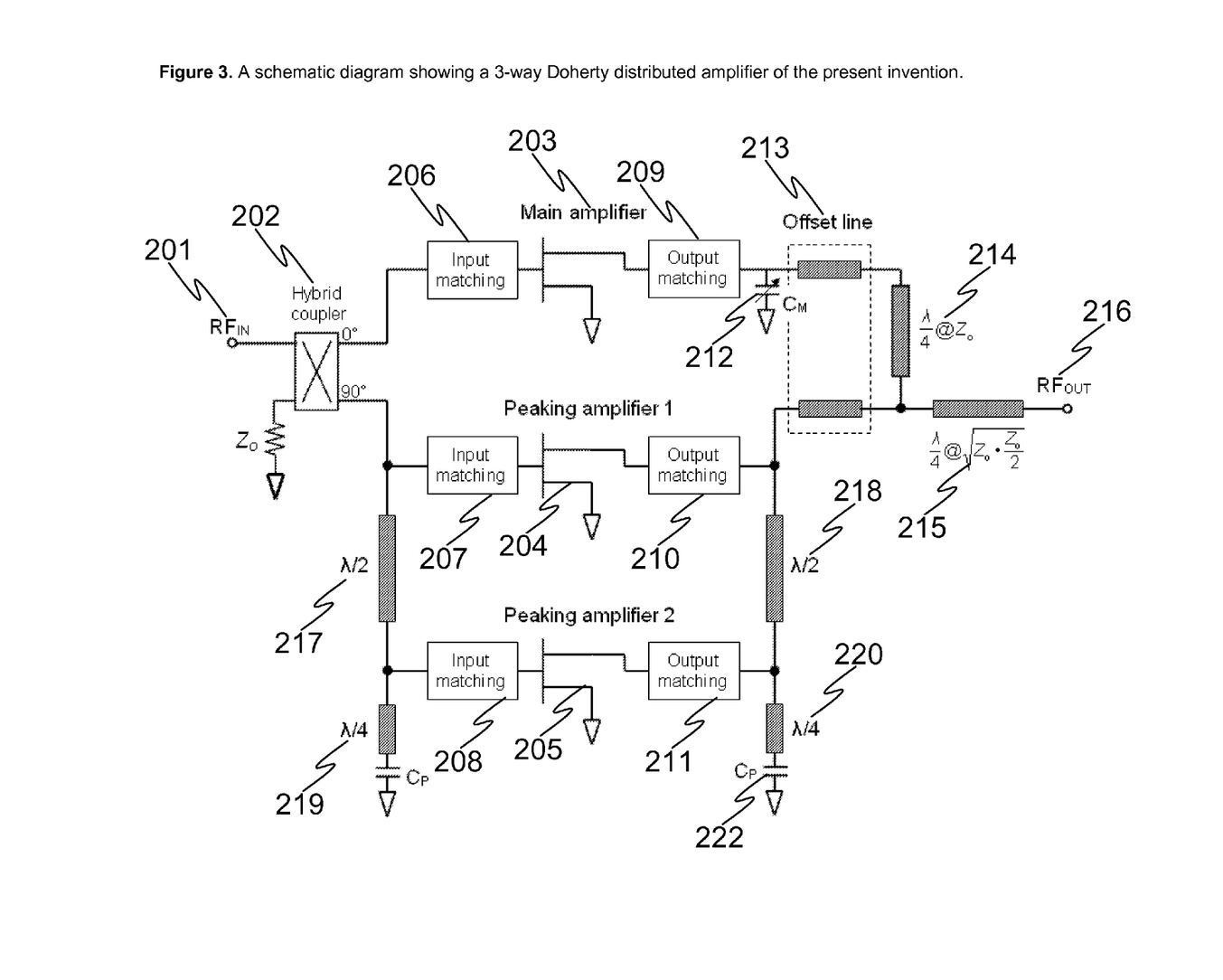
FIG. 3 is a schematic diagram showing an embodiment of a 3-way Doherty distributed amplifier with digital adaptive power tracking in accordance with the present invention.

FIG. 3 is a schematic diagram showing an embodiment of a 3-way Doherty SEDFD amplifier of the present invention. In order to provide high efficiency at a back-off power of 9.5 dB, the amplifier consists of one main amplifier 203 and two peaking amplifiers 204, 205 using the same type of transistors. The RF input signal 201 is passed through a 90° hybrid coupler 202 and divided to a main amplifier 203 and two peaking amplifiers 204, 205. Input impedance matching circuits 206, 207, 208 are connected between the coupler and the main amplifier 203 and the peaking amplifiers 204, 205, respectively. In at least some embodiments, the main amplifier 203 is biased as a Class-AB amplifier and the peaking amplifiers 204, 205 biased as Class-C amplifiers. If the main amplifier is generally biased in Class AB mode, it will have a gain compression characteristic. In contrast, if the peaking amplifier is generally biased in Class C mode, it will have a gain expansion characteristic. In at least some embodiments, the present invention takes advantage of the complimentary characteristics, so that the gain compression of the Class AB main amplifier will be compensated by the gain expansion of the Class C peaking amplifiers to create a more linear power amplifier.

In order to achieve optimized power, output impedance matching circuits 209, 210, 211 are connected to the outputs of the main amplifier 203 and the peaking amplifiers 204, 205. A shunt capacitor $C_M$ 212 is connected to the output impedance matching circuit 209 of the main amplifier 203 so as to optimize the linearity of the NWDPA based on the linearity optimized Doherty amplifier method of U.S. provisional application No. 60/846,905 filed on November 2006, incorporated herein by reference. To obtain peak efficiency point at a desired output back-off power, compensation lines 213 are inserted between output impedance matching circuits 209, 210, 211 and λ/4 impedance transformers 214, 215. The peaking amplifiers 204, 205 are combined using the dual-feed distributed structure which has, in some embodiments, half-wave micro-strip lines 217, 218 at each gate and drain of the first peaking amplifier, shown as a FET for purposes of illustration and clarity. In FIG. 3, the peaking amplifier 1 is combined with the peaking amplifier 2 using a dual-feed distributed structure. The dual-feed distributed structure comprises the half wavelength and quarter wavelength lines and short-circuited quarter-wave length micro-strip lines 219, 220 at each gate and drain of the second peaking amplifier, respectively, connected through the associated input and output impedance matching circuits. The second peaking amplifier is shown in the illustrated embodiment as a single transistor for purposes of simplicity, but could be one or more transistors. The quarter wavelength transmission lines at the output could in some embodiments be replaced by a hybrid coupler.

The half-wave lines 217 and 218 are, in some embodiments, set at the center frequency of the operating power amplifier bandwidth. Shunt capacitors $C_P$ 221, 222 are connected in some embodiments to both ends of the short-circuited quarter-wave length micro-strip lines 219, 220 for optimizing both gain and efficiency characteristics of the NWDPA. Offset line 213 can be included to prevent leakage power between the main amplifier 203 and the peaking amplifiers 204, 205. In some embodiments, the hybrid coupler 202 will cause some gain compression, and this can be compensated by the gain expansion of the peaking amplifiers. An additional hybrid coupler can be connected at the output in some embodiments. Further, those skilled in the art will appreciate that the main distributed amplifiers and peaking distributed amplifiers can be constructed either as separate miniature microwave integrated circuits or on one integrated MMIC.

Figure 10:
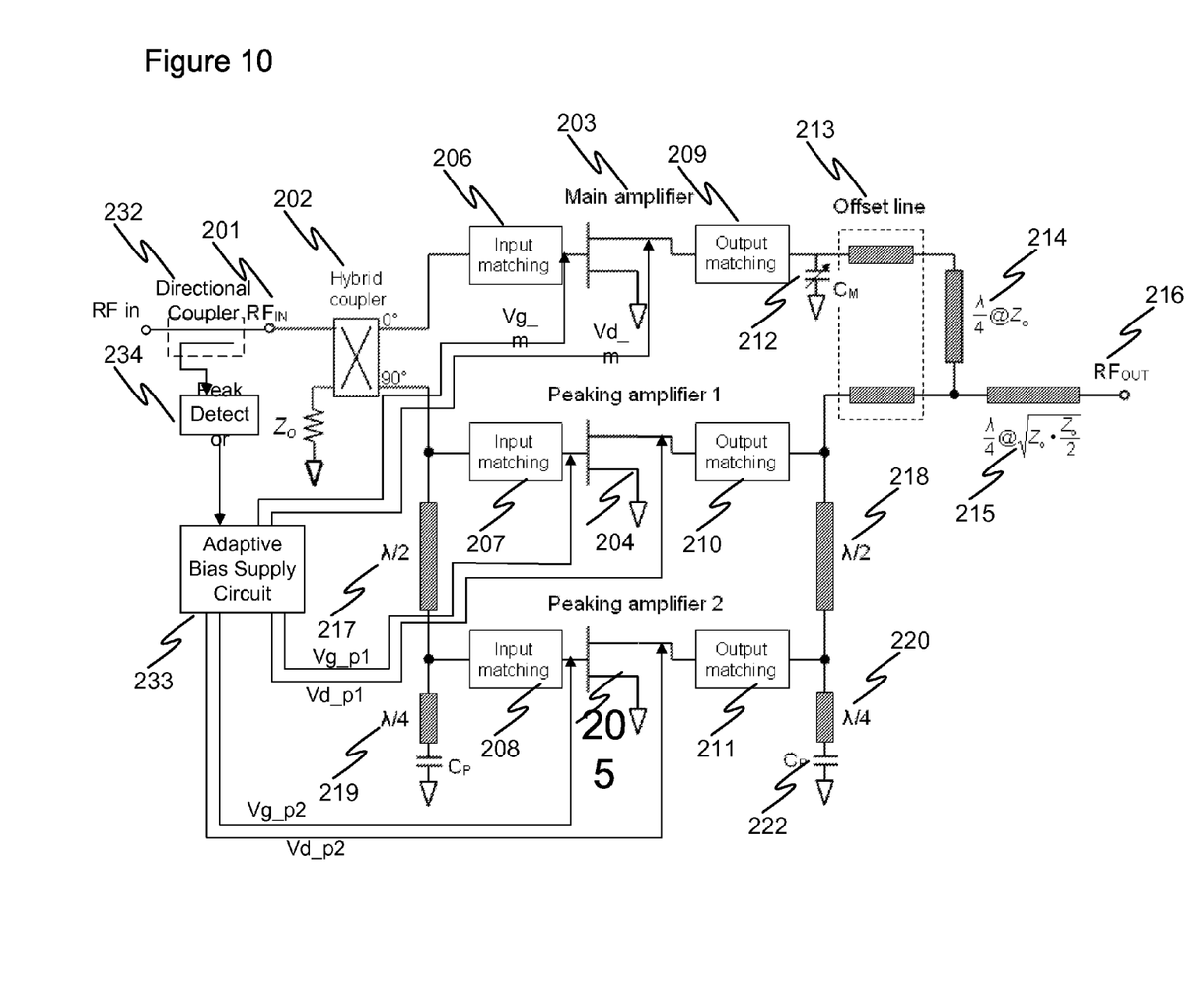
FIG. 10 shows an adaptive power tracking technique based on analog power tracking.
Figure 11:
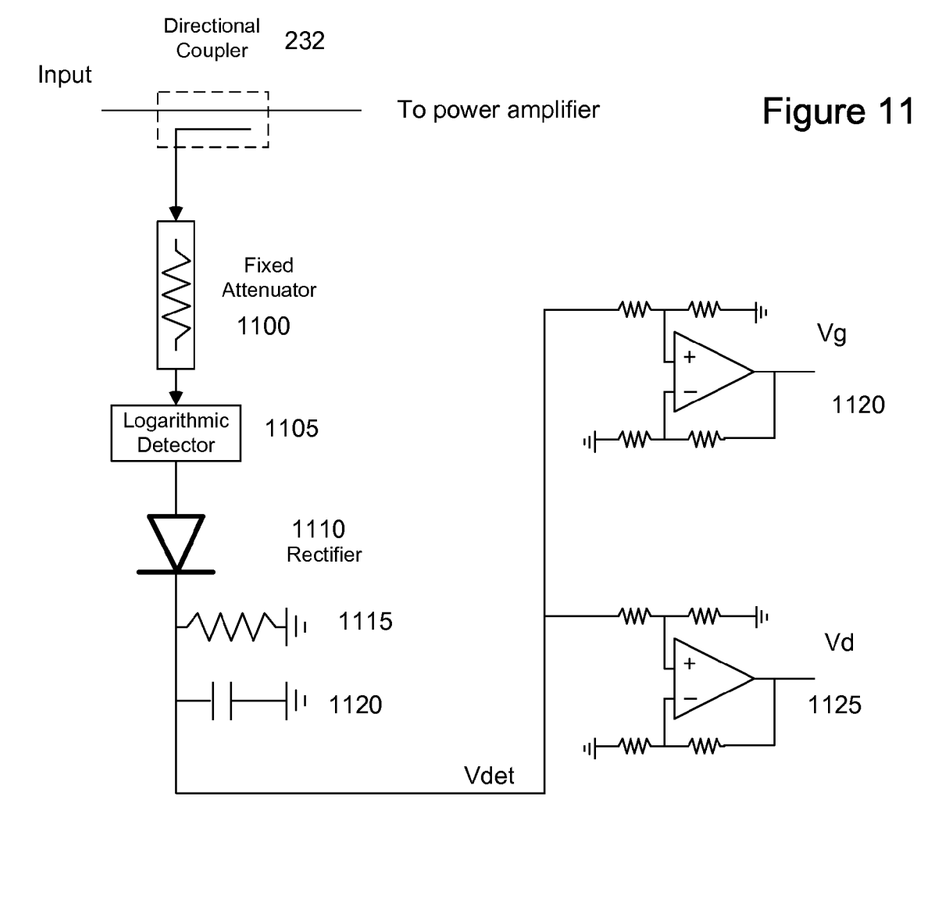
FIG. 11 shows an embodiment of an analog adaptive power tracking circuit.

An embodiment of an analog power tracking system in accordance with the invention is shown in FIG. 10 and comprises two primary blocks: Power detection circuitry 234 and Adaptive Bias Supply Circuit 233, together with the N-way Doherty Amplifier of FIG. 3. For simplicity and clarity, like elements from FIG. 3 are shown with like reference numerals. A directional coupler 232 is typically used at the input of the N-Way Doherty power amplifier. The directional coupler extracts a sampling of the input signal. The output of the Adaptive Bias Supply Circuit 233 is fed to the various gate and drain voltage terminals via an RF choke. The RF choke serves to supply DC bias to the active devices while not altering the RF performance. One possible embodiment of the Power detection circuit 234 is shown in FIG. 11 and comprises an attenuator 1100, logarithmic detector 1105, rectifier 1110 including capacitor 1115 and resistor 1120, and operational amplifiers 1125 and 1130. The value of the capacitor 1115 in the rectifier circuit implementation of FIG. 11 controls the averaging time constant. By setting this time constant much faster than the incoming modulation, the circuit of FIG. 11 performs envelope tracking. By setting this time constant much slower than the incoming modulation, the circuit of FIG. 11 performs average power tracking.

Figure 9:
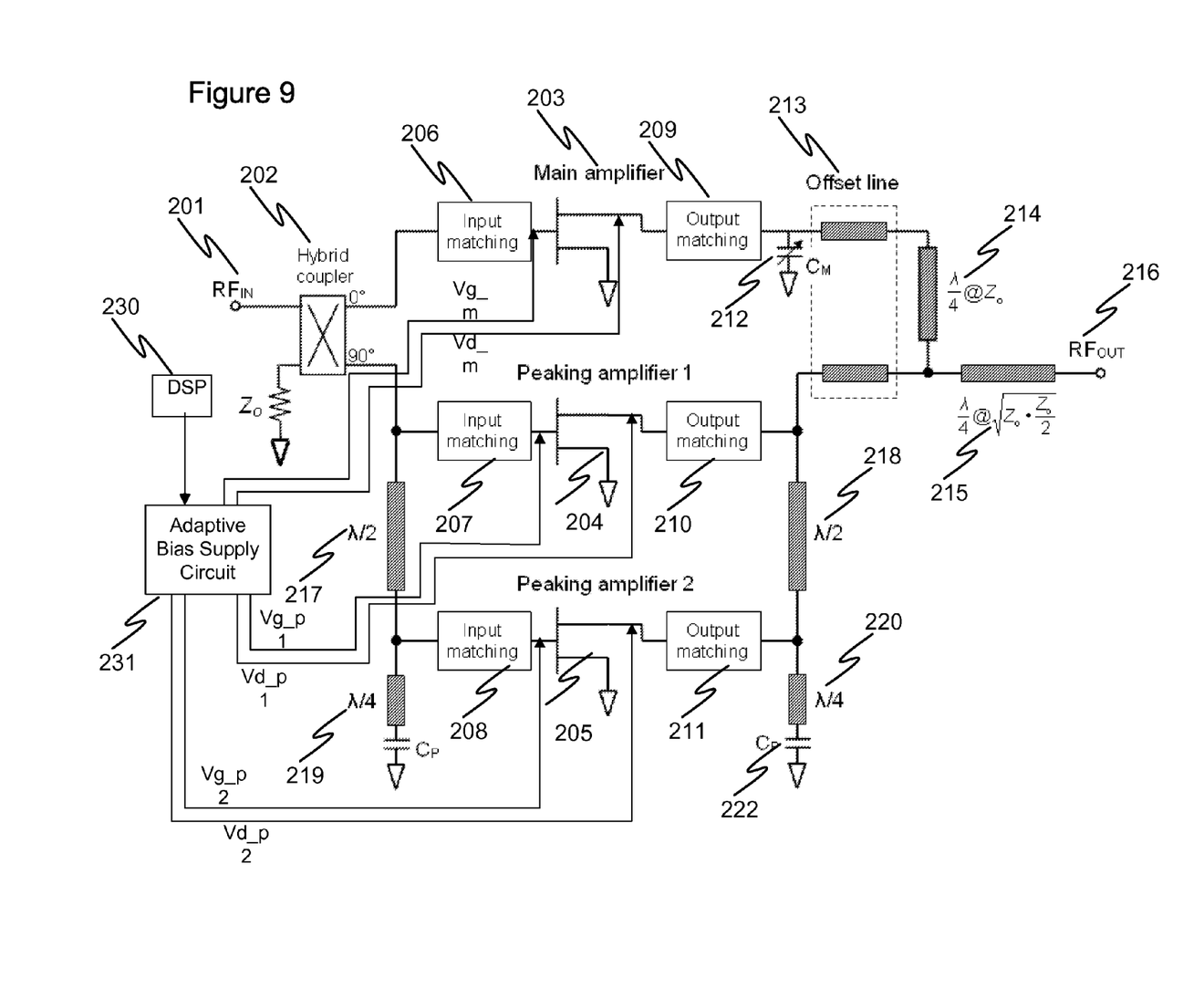
FIG. 9 shows an adaptive power tracking system based on digital signal processing.
Figure 12:
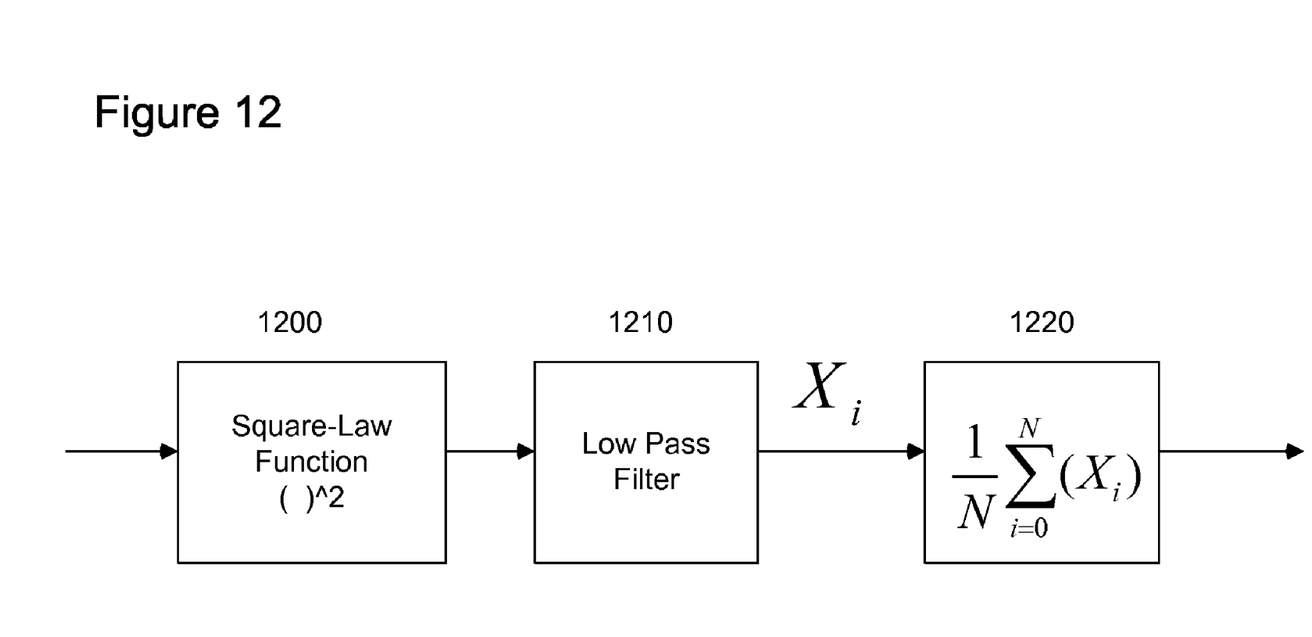
FIG. 12 shows an embodiment of a digital power tracking algorithm.
Figure 13:
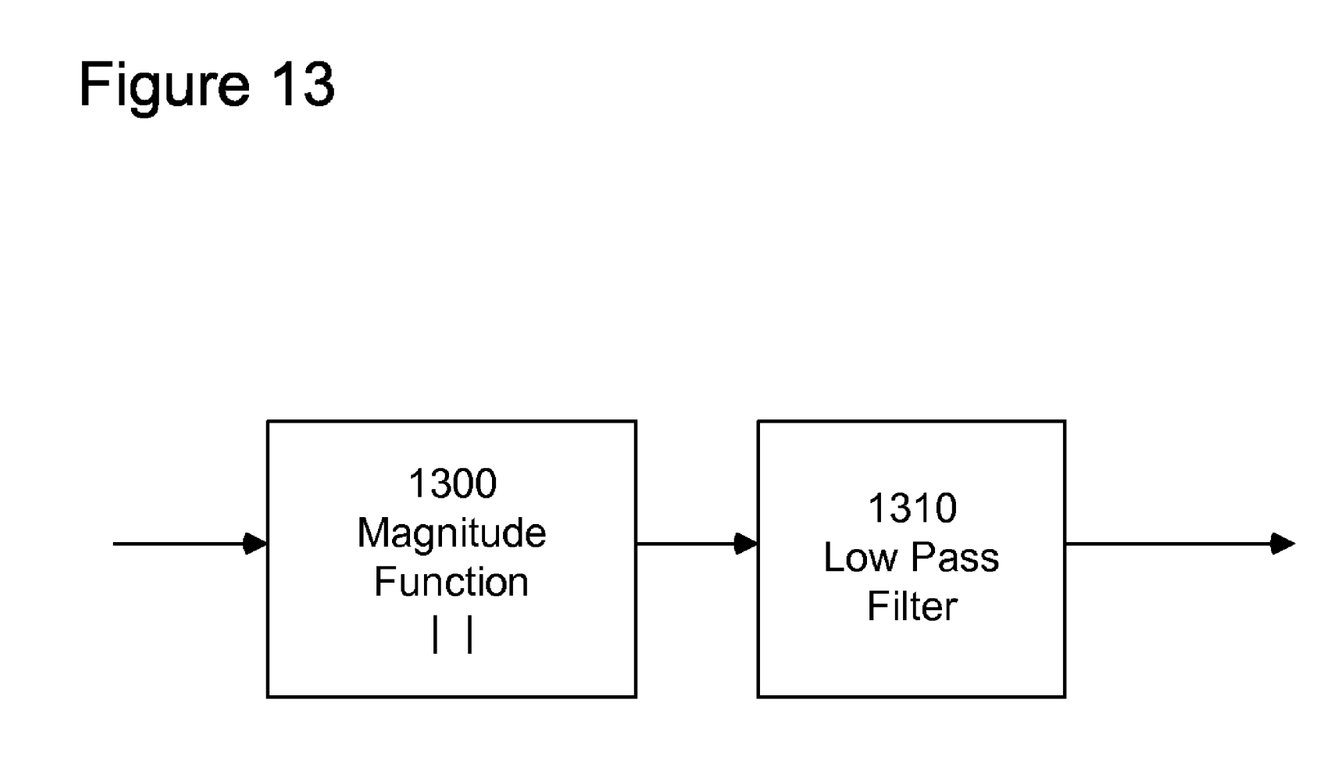
FIG. 13 depicts an embodiment of an envelope tracking algorithm.

The digital power tracking system in FIG. 9 comprises baseband digital signal processing using DSP 230 to extract either the envelope or the average power of the incoming signal as well as an adaptive bias supply circuit 231. The input signal modulation is accessible at baseband using digital signal processing. Therefore, a power detection algorithm can be easily developed at baseband. The output of the DSP power detection algorithm is fed to a Digital to Analog converter which feeds the Adaptive Bias Supply circuit. FIG. 12 shows an embodiment of the average power tracking algorithm based on a digital signal processing implementation, and comprises a square law function 1200 followed by a low pass filter function 1210 and an averaging of the function $X_i$ from 1 to N, as shown, at 1220. The value of N controls the time window for averaging the input power. FIG. 13 depicts an embodiment of an envelope tracking algorithm. The magnitude of the incoming modulation is processed and followed by a low pass filter. No averaging occurs in this implementation.

In examining the performance of NWDPA, a 42 dBm high power amplifier is designed and implemented by using LDMOS FET's with p1 dB of 150 W.

Figure 4:
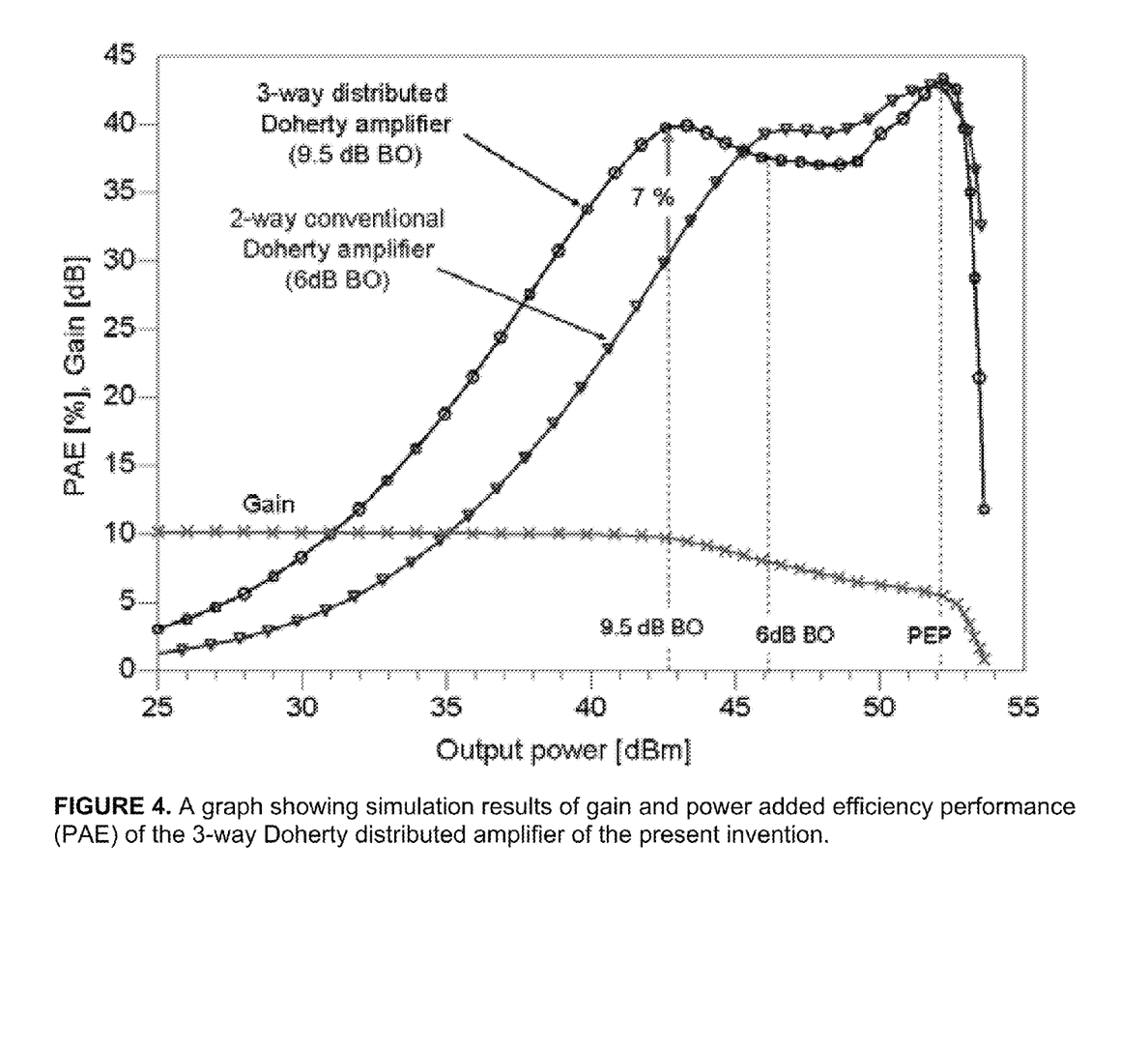
FIG. 4 is a graph showing simulation results of gain and power added efficiency performance (PAE) of an embodiment of a 3-way Doherty distributed amplifier in accordance with the present invention.

FIG. 4 is a graph showing simulation results of gain and PAE for a single tone signal at the frequency of 2140 MHz using a 3-way Doherty distributed amplifier such as shown in FIG. 3. The operating point of the Class AB biased main amplifier is: $I_{DQ}$=510 mA, $V_{GS}$=3.82 V and $V_{DS}$=27 V. The operating points of the Class C biased peaking amplifiers are: 1) Peaking amplifier 1; $I_{DQ}$=0 mA, $V_{GS}$=2.4 V and $V_{DS}$=27 V, 2) Peaking amplifier 2; $I_{DQ}$=0 mA, $V_{GS}$=2.6 V and $V_{DS}$=27 V. The output impedance of the combined peaking amplifier using a dual-feed distributed structure is 4.65+j2.1Ω. An offset line of approximately 0.25λ was inserted; this corresponds to an optimum output resistance of 521Ω. From the simulated results, 43% PAE was obtained at a peak envelope power (PEP) of around 200 W. Consequently, a 40% PAE at 9.5 dB back-off power from the peak efficiency point was achieved. This was an efficiency improvement of approximately 7% in comparison to that of the 2-way conventional Doherty amplifier at a 6 dB peaking point, also shown in FIG. 4. A gain of approximately 10.5 dB was obtained from 2130 to 2150 MHz.

Figure 5:
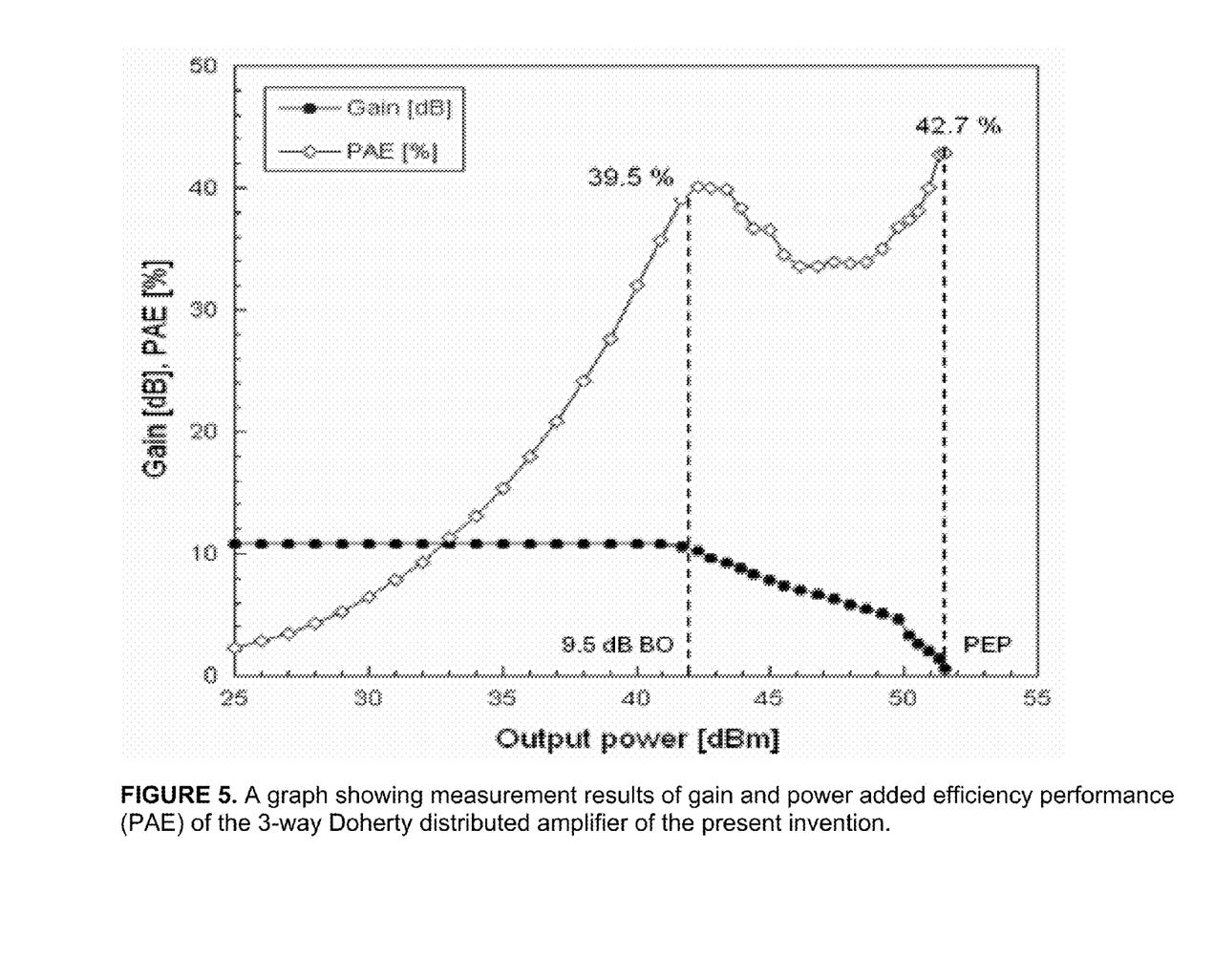
FIG. 5 is a graph showing measurement results of gain and power added efficiency performance (PAE) of an embodiment of a 3-way Doherty distributed amplifier in accordance with the present invention.

FIG. 5 is a graph showing measurement results of gain and PAE of the 3-way Doherty distributed amplifier of the present invention. The main amplifier's operating point is: $I_{DQ}$=480 mA, $V_{GS}$=3.9 V. The operating points of the peaking amplifiers are: 1) Peaking amplifier 1; $I_{DQ}$=0 mA, $V_{GS}$=2.1 V; 2) Peaking amplifier 2; $I_{DQ}$=0 mA, $V_{GS}$=1.9 V. The shunt capacitors, $C_P$ and $C_M$, of 15 pF and 0.5 pF are used, respectively. A 42.7% PAE at PEP of 131 W and 39.5% PAE at 9.5 dB back off are achieved, respectively. A gain of approximately 11 dB was obtained at 9.5 dB back off.

Figure 6:
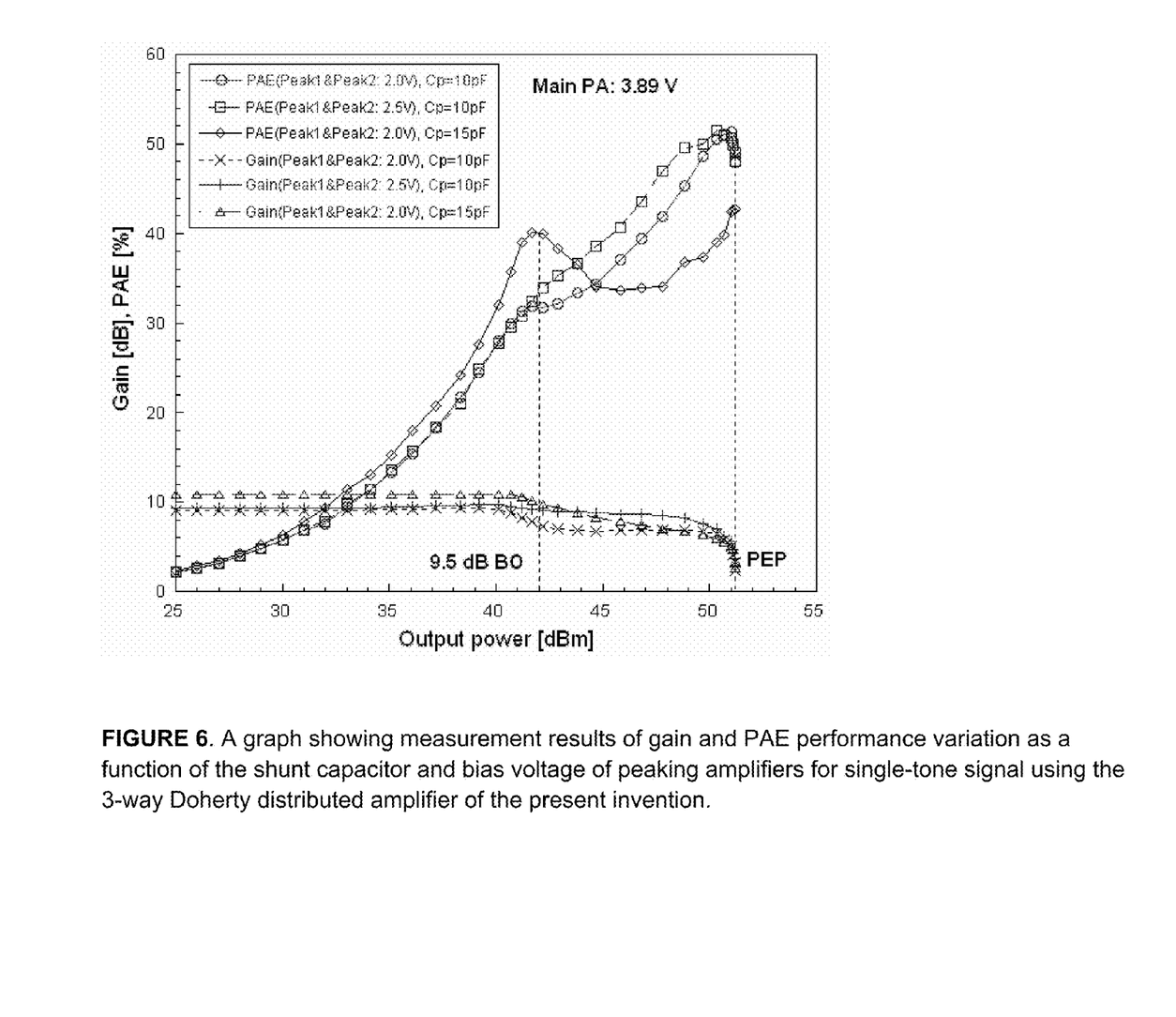
FIG. 6 is a graph showing measurement results of gain and PAE performance variation as a function of the shunt capacitor and bias voltage of peaking amplifiers for a single-tone signal using an embodiment of a 3-way Doherty distributed amplifier in accordance with the present invention.

FIG. 6 is a graph showing measurement results of gain and PAE performance variation as a function of the shunt capacitor and bias voltage of peaking amplifiers for single-tone signal using the 3-way Doherty distributed amplifier of the present invention. Optimization of $C_P$ and the bias point of the two-peaking amplifiers produced efficiency and gain improvement of approximately 8% and 2 dB at 9.5 dB back off, even though the PAE is reduced at PEP.

Figure 7:
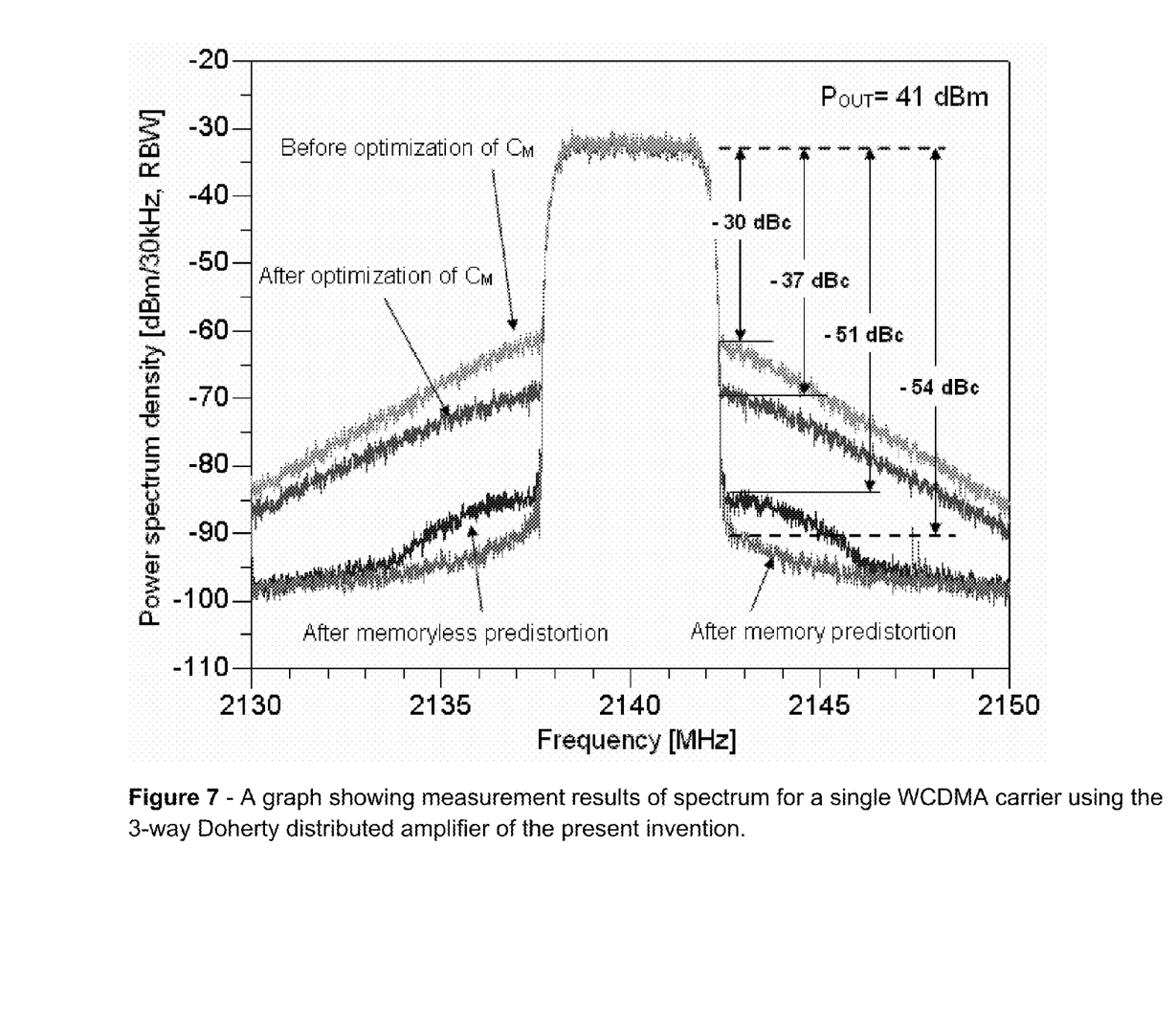
FIG. 7 is a graph showing measurement results of spectrum for a single WCDMA carrier using the 3-way Doherty distributed amplifier of the present invention.
Figure 8:
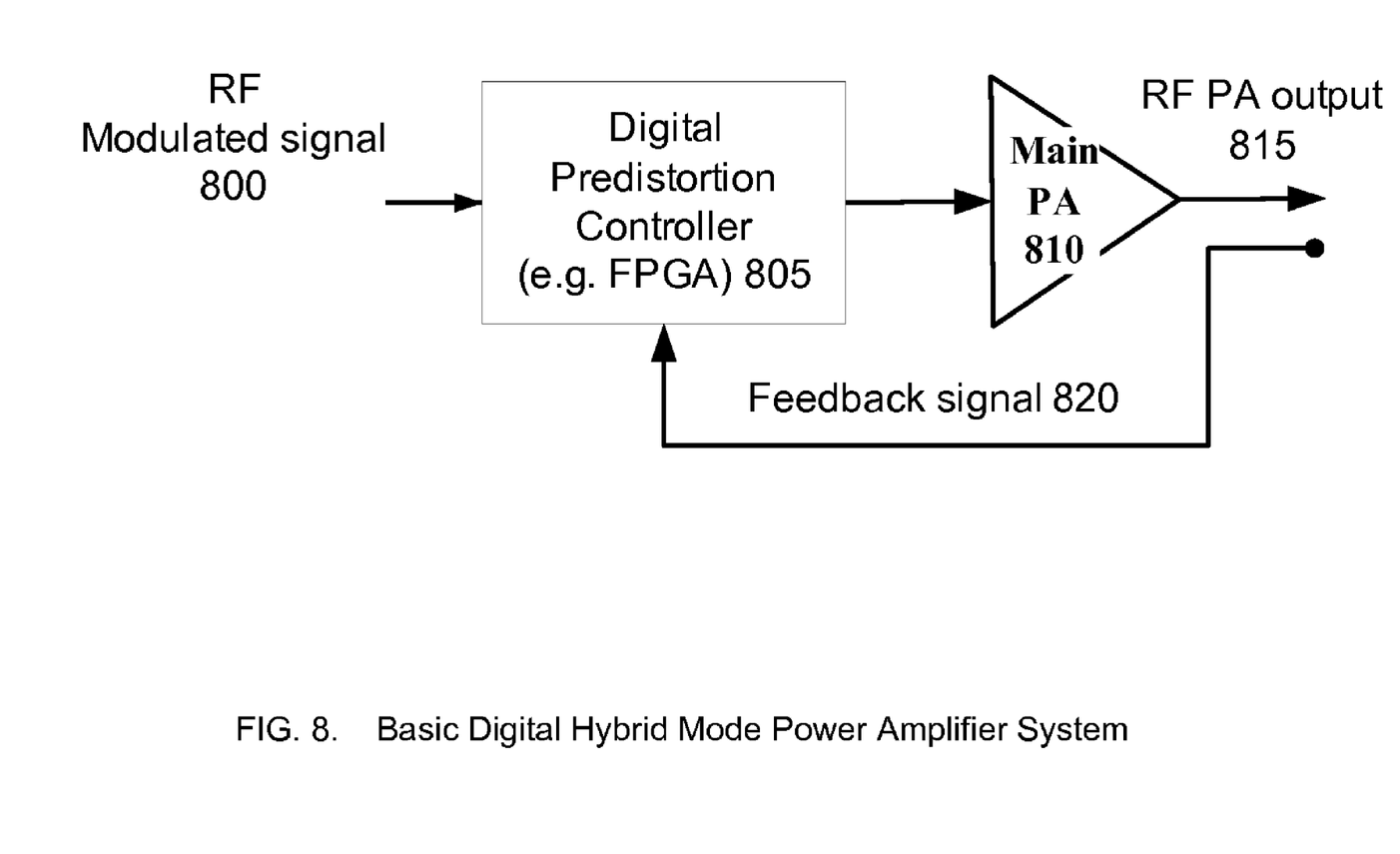
FIG. 8 shows a hybrid mode power amplifier system in accordance with the invention.

FIG. 7 is a graph showing measurement results of spectrum for a single WCDMA carrier using a 3-way Doherty distributed amplifier in accordance with the present invention. The operating points were $V_{GS}$=3.79 V (Main PA), $V_{GS}$=3.1 V (Peaking PA1) and $V_{GS}$=2.5V (Peaking PA2), respectively. The shunt capacitors, $C_P$ and $C_M$, of 9.1 pF and 0.5 pF were used, respectively. In order to achieve high linearity, both memoryless and memory-based digital predistortion were applied. The ACLR performances of −51 dBc after memoryless and −54 dBc after memory compensation were obtained at 41 dBm output power and +2.5 MHz offset frequency.

In summary, the NWDPA of the present invention, compared to the conventional N-way Doherty amplifier, improves the gain performance more effectively since the NWDPA uses a SEDFD structure in conjunction with a Doherty amplifier. A hybrid mode power amplifier system in accordance with the invention is shown in FIG. 4, in which a modulated RF input signal 800 is provided to a digital predistortion controller 805, which in turn provides its output to a power amplifier 810 in accordance with the present invention. The RF output 815 is monitored, and a signal representative of the output is fed back to the controller 805 as a feedback signal 820.

Although the present invention has been described with reference to the preferred embodiments, it will be understood that the invention is not limited to the details described thereof. Various substitutions and modifications are disclosed in the foregoing description, and others will be apparent to those of ordinary skill in the art based on the teachings herein. Therefore, all such substitutions and modifications are intended to be embraced within the scope of the invention as defined in the appended claims.

What is claimed is:

1. A power tracking system for power amplifiers comprising:
   an N-way Doherty distributed amplifier comprising a power splitter with a plurality of outputs and N amplifiers, wherein N is an integer of three or more and an output of the plurality of outputs is coupled to a plurality of the N amplifiers;
   an RF input;
   power detection circuitry responsive to a signal representative of the RF input; and
   adaptive bias supply circuitry responsive to the power detection circuitry for adjusting DC bias applied to the N-way Doherty distributed amplifier in accordance with variations in the RF input.

2. The power tracking system of claim 1 wherein the RF input is single-ended dual-feed.

3. The power tracking system of claim 1 wherein the power detection circuitry and adaptive bias supply circuitry provide envelope tracking.

4. The power tracking system of claim 1 wherein the power detection circuitry and adaptive bias supply circuitry provide average power tracking.

5. The power tracking system of claim 1 wherein the power detection circuitry includes a digital signal processor.

6. The power tracking system of claim 1 wherein the power detection circuitry operates using analog signals.

7. The power tracking system of claim 6 wherein the power detection circuitry comprises a rectifier having a resistor-capacitor pair for setting a time constant.

8. The power tracking system of claim 1 wherein the adaptive bias supply circuit is coupled to a plurality of gate and drain terminals.

9. The power tracking system of claim 1 wherein the adaptive bias supply circuit is operable to output a plurality of gate biases.

10. The power tracking system of claim 1 wherein the adaptive bias supply circuit is configured to adjust gate biases of an amplifier and a shunt capacitor, the N-way Doherty distributed amplifier comprising the amplifier and shunt capacitor.

11. The power tracking system of claim 1 wherein the adaptive bias supply circuit is configured to adjust gate biases of a plurality of amplifiers and shunt capacitors, the N amplifiers of the N-way Doherty distributed amplifier comprising the plurality of peaking amplifiers and shunt capacitors.

12. The power tracking system of claim 1 further comprising an RF choke coupling the bias supply circuitry to an active device, the N-way Doherty distributed amplifier comprising the active device.

13. The power tracking system of claim 4 wherein the power detection circuitry comprises a logarithmic detector, a capacitor, and a rectifier.

14. The power tracking system of claim 1 wherein the power splitter is an M-way power splitter, M being less than N.

15. The power tracking system of claim 1 wherein the output provided to a first amplifier of the plurality of N amplifiers is processed by fewer signal-altering components as compared to the output provided to a second amplifier of the plurality of N amplifiers.

16. The power tracking system of claim 1 wherein a first amplifier of the plurality of N amplifiers directly receives the output and a second amplifier of the plurality of N amplifiers does not directly receive the output.

17. The power tracking system of claim 1 wherein the adaptive bias supply circuitry is configured to apply different biases to be associated with each of N amplifiers in the N-way Doherty distributed amplifier.

18. A method for processing an RF input, the method comprising:
   dividing the RF input into a plurality of resultant signals;
   routing at least one of the resultant signals to a main amplifier;
   routing another of the resultant signals to a plurality of peaking amplifiers;
   detecting a power variable of a signal representative of the RF input; and
   adaptively controlling one or more bias voltages of at least one of the amplifiers based at least partly on the power variable,
   wherein the main and peaking amplifiers are amplifiers in an N-way Doherty distributed amplifier.

19. The method of claim 18 wherein the at least one of the amplifiers comprises the main amplifier and the different peaking amplifiers.

20. The method of claim 18 wherein the one or more bias voltages are DC bias voltages.

21. The method of claim 18 wherein the one or more bias voltages comprise drain and gate bias voltages.

22. The method of claim 18 further comprising adaptively controlling one or more bias voltages of one or more shunt capacitors based at least partly on the power variable.

23. The method of claim 18 wherein the power variable comprises an average power.

24. The method of claim 18 wherein the power variable comprises an envelope.

25. The method of claim 18 wherein the another of the resultant signals provided to a first amplifier of the plurality of peaking amplifiers is processed by fewer signal-altering components as compared to the another of the resultant signals provided to a second amplifier of the plurality of peaking amplifiers.

26. The method of claim 18 wherein a first amplifier of the plurality of peaking amplifiers directly receives the another of the resultant signals and a second amplifier of the plurality of peaking amplifiers does not directly receive the another of the resultant signals.

27. The method of claim 18 wherein the one or more bias voltages comprises at least three different bias voltages.

* * * * *